United States Patent [19]
Dabiri et al.

[11] Patent Number: 5,996,112
[45] Date of Patent: Nov. 30, 1999

[54] AREA-EFFICIENT SURVIVING PATHS UNIT FOR VITERBI DECODERS

[75] Inventors: Dariush Dabiri; Daniel A. Luthi, both of San Jose; Advait M. Mogre, Fremont, all of Calif.

[73] Assignee: LSI Logic Corporation, Milpitas, Calif.

[21] Appl. No.: 08/785,391

[22] Filed: Jan. 21, 1997

Related U.S. Application Data

[60] Provisional application No. 60/014,394, Mar. 28, 1996.

[51] Int. Cl.⁶ .............................. G06F 11/10; H03D 1/00
[52] U.S. Cl. ........................ 714/795; 714/792; 375/341
[58] Field of Search .................................. 714/795, 792; 375/341

[56] References Cited

U.S. PATENT DOCUMENTS

| | | | |
|---|---|---|---|
| 5,327,440 | 7/1994 | Fredrickson et al. | 371/43.7 |
| 5,533,065 | 7/1996 | Blaker et al. | 371/43.7 |

*Primary Examiner*—Hoa T. Nguyen

[57] ABSTRACT

This invention concerns a novel Viterbi decoding apparatus and method in which a survivor path unit (SPU) implements the traceback method with a RAM which stores path information in a manner which allows fast read access without requiring physical partitioning of the RAM. This results in an implementation that requires less chip area than conventional solutions.

17 Claims, 7 Drawing Sheets

| State $t$ | Code Word for: | | State $t+1$ | |
|---|---|---|---|---|
| | 0 | 1 | | |
| 000 | 000 | 111 | 000 | $W^{t+1}_{000} = \min\{(W^t_{000} + M^t_{000}), (W^t_{001} + M^t_{111})\}$ |
| 001 | 111 | 000 | 001 | $W^{t+1}_{001} = \min\{(W^t_{010} + M^t_{101}), (W^t_{011} + M^t_{010})\}$ |
| 010 | 101 | 010 | 010 | $W^{t+1}_{010} = \min\{(W^t_{100} + M^t_{011}), (W^t_{101} + M^t_{100})\}$ |
| 011 | 010 | 101 | 011 | $W^{t+1}_{011} = \min\{(W^t_{110} + M^t_{110}), (W^t_{111} + M^t_{001})\}$ |
| 100 | 011 | 100 | 100 | $W^{t+1}_{100} = \min\{(W^t_{000} + M^t_{111}), (W^t_{001} + M^t_{000})\}$ |
| 101 | 100 | 011 | 101 | $W^{t+1}_{101} = \min\{(W^t_{010} + M^t_{010}), (W^t_{011} + M^t_{101})\}$ |
| 110 | 110 | 001 | 110 | $W^{t+1}_{110} = \min\{(W^t_{100} + M^t_{100}), (W^t_{101} + M^t_{011})\}$ |
| 111 | 001 | 110 | 111 | $W^{t+1}_{111} = \min\{(W^t_{110} + M^t_{001}), (W^t_{111} + M^t_{110})\}$ |

FIG. 2
(PRIOR ART)

ature of state-independent decodability. A block encoder can be
AREA-EFFICIENT SURVIVING PATHS UNIT FOR VITERBI DECODERS This application claims the benefit of U.S. Provisional Application No. 60/014,394 filed Mar. 28, 1996.

BACKGROUND OF THE INVENTION

1. Field of the Invention

This invention relates to a method and apparatus for decoding convolutionally encoded signals. Such signals are commonly used in communications and recording systems which employ error correction to combat signal corruption. The convolutional decoders discussed here are based on the Viterbi algorithm, in which weights are calculated for transitions which form survivor paths through a decoder trellis. The decoding then takes the form of tracing the most likely survivor path. More specifically, this invention concerns a novel method for storing survivor paths which when implemented leads to a significant reduction in circuit complexity and silicon area needed to implement the convolutional decoder apparatus hereof.

2. Description of the Relevant Art

Error correction codes function by accepting input data symbols and processing them in such a way as to add some redundancy to the symbol sequence. One way this is commonly done is to increase the number of symbols in the sequence, so that for every k symbols that enter the encoder, n symbols are dispatched by the encoder. The input and output symbols are generally binary digits (bits), and the information throughput is represented as a code rate of k/n.

The most popular form of error correction codes are block codes. Block codes are characterized by the feature of state-independent decodability. A block encoder can be implemented as a lookup table in which the input data word is used as an address, and the code word corresponding to the input data word is given by the contents of the table at that address. In this way a one-to-one mapping from input data words to code words is achieved. A simple decoding algorithm is to compare the received code word to all possible code words, choose the "closest" code word, and use the chosen code word as an address in a second lookup table that contains the input data word which corresponds to the chosen code word. The state-independence is a result of the one-to-one mapping that ensures each code word has only one possible interpretation. One drawback of block coding is that for adequate performance, many systems require codes with very long block lengths, necessitating large memories or more complex encoding and decoding algorithms.

As an alternate approach, short block lengths can be used, but some restrictions are added to which code words can be used. With block coding, each of the code words could be used at any time as dictated by the current input data word. This is not the case with convolutional coding, where the code words which can be used are influenced by previous input data words as well as the current input data word. This increases the effective "length" of code words by extending the range of influence of an input data word beyond one code word. As a consequence, however, there is not a one-to-one mapping from the input data words to code words, and the encoding and decoding processes are more involved.

FIG. 1 illustrates one example of a convolutional encoder. Encoder 110 includes a series of adders 116 interposed between a shift registers 114 and a time multiplexer 118. Encoder 110 accepts one bit at each time step and produces three bits. Shift register 114 shifts its contents to the right one bit per time interval, accepting a new bit from the input data stream 112 in the process. Shift register 114 exemplifies a four-bit wide register which contains the current input data bit and the three previous data bits. The three previous bits are considered to form the "encoder state". When the shift register shifts again to the right, the current input data bit will become the most significant bit of the encoder state, thereby causing a transition to the new state. As more input data enters the shift register and the register again shifts, another transition occurs. As these transitions continue to occur, a sequence forms. This sequence of transitions between encoder states is often referred to as a path.

Associated with each transition in the path is a three bit code word that is formed based on the current input bit and the current encoder state. The contents of the shift register 114 are added together in different ways by three adders 116. The topmost adder adds the values of the first, third and fourth bits in the shift register. The middle adder adds the values of the first, second and fourth bits, and the bottom adder adds the values of all four bits. In each case, the summation is done modulo two, so that the output of the adder is one if the result is odd, and zero if the result is even. The adder outputs are passed to the time multiplexer 118 to form the output code word. Time multiplexer 118 then switches three times to pass its contents to the output line 120 before the next input bit is accepted. The rate of this encoder is thus 1/3. The number of encoder states is $2^3=8$ since three previous input bits are held in shift register 114.

In summary, convolutional encoder 110 accepts one input bit ($I_1$) per time step and calculates a three bit code word based on the input bit and the encoder state, wherein the encoder state shown comprises the past three input bits ($B_1$, $B_2$ and $B_3$). The sequence of code words passes through a transmission channel which is typically subject to interference (i.e. channel disturbances which may include random noise) that may corrupt the sequence of code words. To decode the code word sequence, a decoder will attempt to reverse the encode process and decide what the input bit is, based on the code word and state of the encoder. However, the decoder does not know for certain what the state of the encoder is, so the decoder often maintains a decision unit for each possible encoder state. The decoding decision will be based on the most likely sequence of encoder states as determined by the sequence of code words.

To decode the code word sequence, a time-expanded version of the encoder state transition diagram is formed. When all of the possible transitions from a state at time t to a state at time t+1 are shown, the resulting diagram is one stage (hereafter called a time step) of a trellis. FIG. 2 depicts an example of one time step of a decoder trellis. The eight states the encoder could be in at a given time t are listed on the left in FIG. 2, and the eight states the encoder could be in at time t+1 are listed on the right. The lines (hereafter referred to as edges) in FIG. 2 represent the possible state transitions. For example, if at time t the encoder is in state 000 and the current input bit is 1, at time t+1 the encoder will be in state 100. This follows from the adder configuration shown in the example encoder of FIG. 1. Namely, if $B_1$, through $B_3$ at time t are all 0 and input bit $I_1$, is 1, then the code word $C_1$ through $C_3$ output from adders 116 is 111, respectively. That code word represents an ideal transition from state 000 at time t to 100 at time t+1, given an input bit $I_1$, of 1. The only other possible transition from state 000 at time t occurs when the current input bit is 0, which results in a transition to state 000 at time t+1. For all states shown, the uppermost edge illustrates a state transition resulting from a current input bit of 0, and the lower edge illustrates a state transition resulting from a current input bit of 1. The trellis shown in FIG. 2 thereby duplicates the effects of shift register 114 which produces a state transition by shifting the current input bit into the most significant bit position of the encoder state.

Shown in FIG. 2 are the code words that correspond to each transition from state t to t+1. The code words are those produced by encoder 110 based on the current input bit and the encoder state. For an input bit of 0, the encoder state can transition from, e.g., 010 at time t to 001 at time t+1 having an output code word of 101. This correspondence was determined from FIG. 1 where it can be seen that when $I_1$, $B_1$, $B_2$, and $B_3$ are 0, 0, 1, and 0, respectively, adders 116 produce a 101 into bit locations $C_1$, $C_2$ and $C_3$ of register 118. Similarly, the encoder state transition from 010 at time t to 001 at time t+1 having an output code word of 101.

FIG. 2b shows a time expansion, i.e., multiple time steps beyond simply t and t+1 of FIG. 2). The time steps indicate a decoder trellis beginning at time t=0 to time t=6. At each time step, the decision units of the decoder contain the weight of the most likely path to the state of interest. Thus, the decoder trellis contains multiple paths from an initial state to a given state several time steps later; however, only one path has the lowest weight and therefore is the most likely path. The most likely path to a particular state within a given time step is found by starting at that particular state at that given time step and tracing backward along the chosen transitions which are drawn with the thick lines. If no more code words are received, the decoding may be performed by choosing the state at time t=6 with the smallest weight as the most likely encoder state and following the most likely path to that state from left to right. An input bit of 0 is decoded if the path follows the top transition from a state, and a 1 is decoded if the path follows the bottom transition from a state. In FIG. 2b the decoded data as indicated by the trail of thickest lines found by tracing backward from state 000 at time t=6 is 010000. The trail of thickest lines is herein referred to as the path having the lowest weight, e.g., "4" at time t=6 in the example provided. Details on the calculation of the weights and selection of the transitions follow.

The decoder is initialized by setting the weight of the first state (e.g. state A) at time t=0 to zero and the rest of the weights of states at time t=0 to a large number (in the figure this number is represented by X). This is done because it has been decided ahead of time that the initial state of the encoder is 000. Thereafter as code words come in at each time step, a metric (defined here to be a measure of difference between two signals) is formed for each code word which effectively measures the distance from the signal received at that time step to the code word. Classically, the metric used is the squared Euclidean distance. As an example, assume that at time t=0 the received signal is 100. Then the metrics M for each of the eight possible code words are $(c_1-1)^2+(c_2-0)^2+(c_3 0)^2$ which yields the following results:

$$M^t_{000} = 1 \quad M^t_{001} = 2 \quad M^t_{010} = 2 \quad M^t_{011} = 3$$

$$M^t_{100} = 0 \quad M^t_{101} = 1 \quad M^t_{110} = 1 \quad M^t_{111} = 2,$$

where $M^t_c$ equals the metric at time t for code word c.

Each state at time t>0 has associated with it a weight and a path. As will be explained in greater detail further below, the weight associated with each state is defined as the sum of the metrics formed by the most likely path to that state.

In the example provided in FIG. 2b, the weights of each state at state t=1 starting at the top state and traversing downward are 1XXX2XXX. Likewise the weights of each state at state t=6 starting at the top state are 45765666. The path is the most likely sequence of transitions that would have been taken by the encoder if indeed it is in that state. As an example, the received code word upon the decoder is 100, followed by 010, followed by 111, etc. However, instead of 100 at time t=0, the decoder should have received 000 or 111. The distance (metric) between the received signal and code word 000 is 1. Thus, the transition from state A in state t=0 to state B at time t=1 has a metric of 1. The weight of a transition is found by adding the metric to the weight of the state from which it originates. The transition from state A to state B thus has a weight of 0+1. Conversely, the distance between 100 and 111 (i.e., code word for input bit of 1 and a transition from state 000 to state 100—shown in FIG. 2) is 2. Thus, the metric from state A to state C is 2. The weight of the transition from A to C is then 0+2. The weight of state B or state C is the minimum weight of the incoming transitions. Thus, since the weight of the transition from state A to state B is 1, and the weight of the other incoming transition is a large number, then the weight of state B is 1. Similarly, the weight of state C is 2. The transitions which are chosen as having the minimum weights become path extensions. If at state C, the transition from state A to state C is chosen as the incoming transition with minimum weight, the most likely path to state C becomes the most likely path to state A plus the transition from state A to state C.

At any given time the encoder has only one state, but the decoder maintains a decision unit for all possible encoder states. Hence, each node in the decoder trellis corresponds to a decision unit. The decision units each track the weight of one state, and their decisions are passed to a memory unit which tracks the corresponding paths.

The weight associated with each state is defined as the sum of the metrics formed by the most likely path to that state. In the decoder trellis shown in FIG. 2b, each of the paths to the states at time t will have two possible extensions formed by the two transitions from each possible encoder state. The weight of each state at time t+1 is found by choosing the minimum weight of the two incoming transitions, where the weight of a transition is defined as the sum of the weight of the state it originates from and the metric of the code word that corresponds to that transition. The new path for the state at time t+1 is then the path to the originating state (at time t) that was chosen plus the transition.

The aforesaid decoding method was conceived by A. J. Viterbi who realized that any paths which merged to a common encoder state would have the same possible extensions and hence would not possess any distinguishing characteristics beyond that point. Therefore, making a decision at the merge point does not cause any loss of optimality, but will significantly reduce the decoding complexity since only a constant number of paths needed to be kept in memory. Even so, the decoding algorithm outlined above still possesses significant complexity in that each edge of the decoder trellis requires the calculation of a weight value, and a comparison and selection process must be performed to determine the transition with the minimum weight.

As an exercise to illustrate the complexity of the decoder, consider the steps taken by the decoder to update the state weights after a code word is received. First, a metric is calculated for each of the possible code words. For this example that translates into three additions, three squarings, and two more additions for each of eight code words yields 40 additions and 24 multiplications. Second, a weight is calculated for each edge in the trellis diagram. For this simple example there are 16 edges, necessitating 16 additions. Third, for each state all the weights of the incoming transitions must be compared to determine the smallest. The two edges per state in this example need only 1 comparison, yielding a total of 8. In total, 56 additions, 24 multiplications, and 8 comparisons are needed per time step. One technique for reducing the number of operations which perform the metric calculation described in the first step will be outlined hereinafter. One of the major concerns which remains to developers is the number of operations needed for the second and third steps. The number of edges in convolutional codes is an exponential function.

In the example provided, each state has two incoming edges, so only one comparison and selection is necessary to determine the transition with the minimum weight. In the general case, the number of edges entering a state is $2^r$ (r is an integer determined by the decoder trellis), which requires r rounds of comparison and selection. In each round of the compare and select process, the edges are grouped into pairs and compared. Of the two, the edge representing the transition with the smaller weight is "selected", which means only that the other edge is dropped from candidacy since it can no longer represent the minimum weight transition. Consequently in each round, half of the edges are dropped from candidacy, and after r rounds, only the edge representing the minimum weight transition remains. The minimum weight transition for a state is referred to as a "survivor", the weight associated with the survivor is referred to as the survivor weight, and the path associated with the survivor is referred to as the survivor path. In the example depicted in FIG. 2b, the survivor path is illustrated with a sequence of thicker lines extending from states ABDEFGH. The survivor weight is the weight of the survivor path culminating at state H as having a weight of 4. State H weight is the sum of all previous transition weights within the survivor path as determined by the summation of the immediate preceding state weights and the metric between the preceding state and the state of interest.

Comparison and selection process must be performed for all states and for every code word received. Computational overhead for a Viterbi decoder can therefore be substantial. As shown in FIG. 3, Viterbi decoder 130 may be divided into two sub-units: an add-compare-select array (ACS array) 134 and a survivor path unit (SPU) 136. The metric calculation, addition, weight comparison and survivor path selection all take place within the ACS array. Thus, ACS array 134 contains the weight values at each state, as a progression along survivor path. The weight values are necessary, when making a comparison to other weights in other paths, to determine a survivor path. The compilation and comparison functions which take place within the ACS array 134 allow determination of path extensions. Signals indicating the extensions to the survivor paths are passed from the ACS array to the SPU which then updates the survivor paths. The SPU also functions to provide decoded symbol decisions based on the survivor paths. Two popular methods exist for implementing the SPU: the register exchange method, and the traceback method. Only the traceback method is discussed herein.

To illustrate the traceback method, a random access memory (RAM) is used. The RAM is organized into rows and columns. The columns represent time steps, i.e., t=0, t=1, etc. in the decoder trellis, and the rows represent the states, i.e., B,C, etc. at each time step. Each location in the RAM is assumed to hold a pointer to a state in the previous column, the state from which the surviving path to the current state originates. Note that this pointer may take the form of the input bit $I_1$, which would have caused the chosen transition to the current state. This approach requires the addition of some external logic gates which generate the address of the state in the previous column when given the address of the current state and the contents of the current state.

The traceback method operates in the following manner: At each time step, the chosen transitions are stored in a column. One state is chosen as a starting point, and a traceback begins. The traceback consists of repeated reads from the RAM, each read accessing a column which precedes the column last accessed. The row used in each read is specified by the contents of the location last read. In this manner, it is possible to "trace backward" through the RAM and, more specifically, through the decoder trellis as described in FIG. 2b. After tracing backward a fixed number of steps, the last transition is rendered as a decoded bit in similar fashion to the previous method.

Note that in the traceback method, many reads must be performed during each decoding cycle. This places very demanding requirements on the speed of the RAM. Several approaches have been taken in an attempt to address this problem. Utilizing the principle that speed of a RAM typically inversely proportional to its size, some of these approaches focus on substituting several smaller RAM arrays for one larger RAM. Whatever speed is gained in the RAM operation, design complexity is increased by requiring additional decode, read/write, and pointer logic, and the associated requirement for a larger silicon chip area.

SUMMARY OF THE INVENTION

The problems outlined above are in large part solved by a novel survivor path unit (SPU) which implements the traceback method with a RAM which stores path information in a manner which allows fast read access without requiring physical partitioning of the RAM. This results in an implementation that consumes less chip area than conventional solutions.

Broadly speaking, the present invention contemplates an apparatus for Viterbi decoding a possibly corrupted encoded signal. The apparatus can determine survivor weights and thereafter store and update survivor paths. The apparatus includes a module which facilitates the traceback decoding of survivor paths by storing the traceback information in a novel manner which reduces the required chip area relative to conventional implementations.

The present invention further contemplates a digital communications system comprising an encoder, a discrete-time channel, and a Viterbi decoder. The encoder serves to convert a digital signal to an encoded digital signal containing a sequence of code words. The encoded digital signal may then be transmitted through a transmission channel or written to a storage medium and read therefrom. These actions are represented in the form of the discrete-time channel. The encoded and possibly corrupted signal output from the discrete-time channel is received by a Viterbi decoder comprising a circuit for survivor weight determination and a memory for storing and updating survivor paths. The memory is used to store information in a novel manner which facilitates traceback decoding of survivor paths, thereby permitting a reduction in implementation area relative to conventional implementations.

The present invention yet further contemplates a method for reducing the area required to implement a traceback decoding technique on stored survivor sequences. This method includes a pre-storage manipulation of the surviving path information and a novel traceback technique to take advantage of the novel storage format used. This method requires a lower memory-read bandwidth, thereby allowing the use of a single RAM and less external logic circuitry.

BRIEF DESCRIPTION OF THE DRAWINGS

Other objects and advantages of the invention will become apparent upon reading the following detailed description and upon reference to the accompanying drawings in which:

FIG. 2 is a trellis diagram indicating numerous transition paths between states produced by the eight state, rate 1/3 convolutional encoder of FIG. 1;

Figure 1:
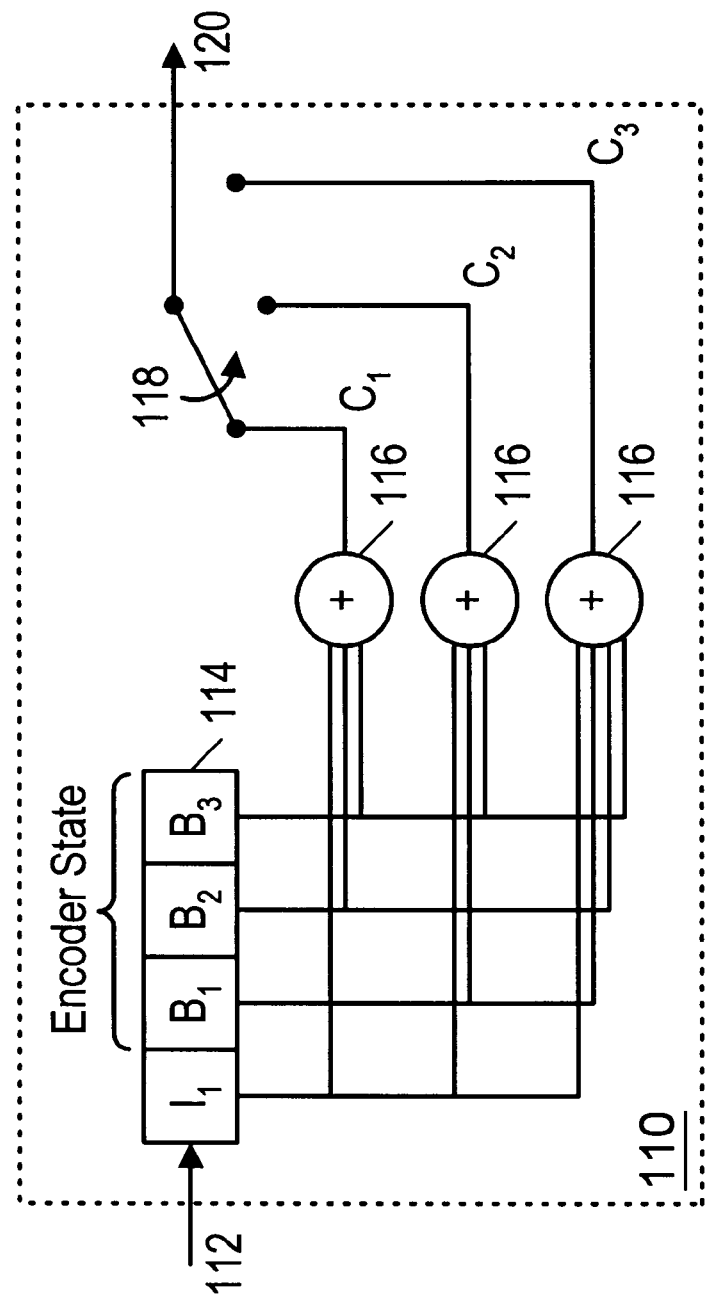
FIG. 1 is a functional schematic diagram of an eight state, rate 1/3 convolutional encoder.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
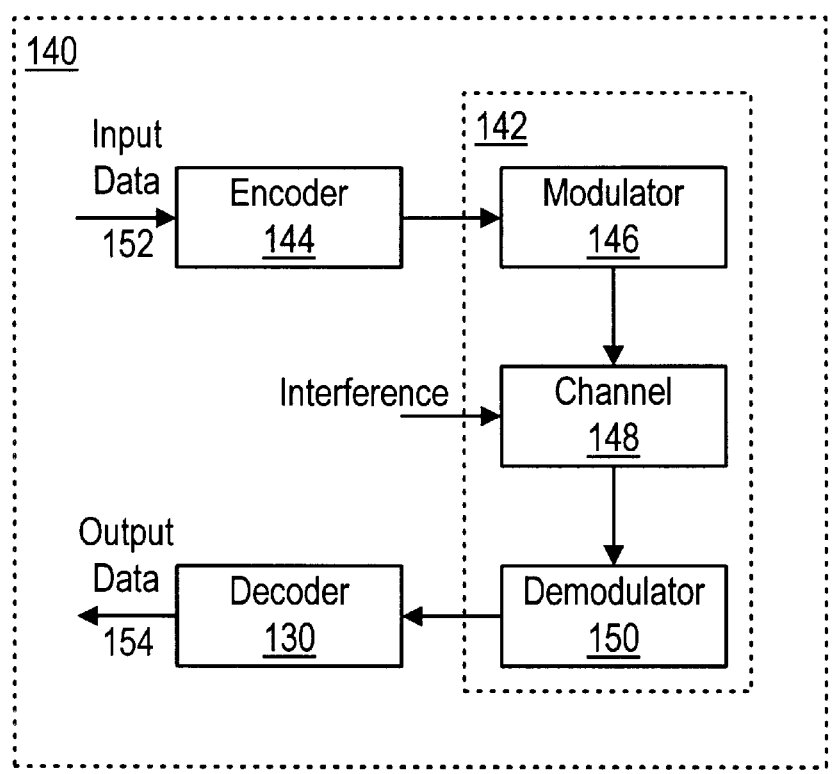
FIG. 4 is a block diagram of a digital communications system which employs error correction coding and subsequent decoding according to the present invention.

Turning now to the drawings, FIG. 4 represents a digital communications system 140 comprising a discrete-time channel 142 interposed between an encoder 144 and a Viterbi decoder 130. Discrete-time channel 142 comprises a modulator 146, a channel 148, and a demodulator 150. Channel 148 may be a transmission channel or a storage medium being written to and read from. Modulator 146 serves to translate a digital output signal from encoder 144 into signals suitable for channel 148, and thereafter drives the signals across channel 148. Channel 148 may suffer from interference that corrupts said signals, the interference possibly taking form in any combination of additive noise, cross channel interference, multi-path interference, and channel fading. Demodulator 150 serves to receive the signals from channel 148 while minimizing the interference as much as is practical, and thereafter translate the signals into digital signals for input to decoder 130. Discrete-time channel 142 can thus be viewed as a unit accepting digital input signals and producing possibly corrupted digital output signals. A device which can impute noise onto an input signal can therefore be considered a channel and consequently falls within the scope an context of a channel as used herein.

Encoder 144 is a convolutional encoder which serves to add redundancy to input data signal 152. The added redundancy allows for detection and correction of errors that may result from corruption of signals passing across discrete-time channel 142. The error detection and correction is performed by Viterbi decoder 130.

Figure 5:
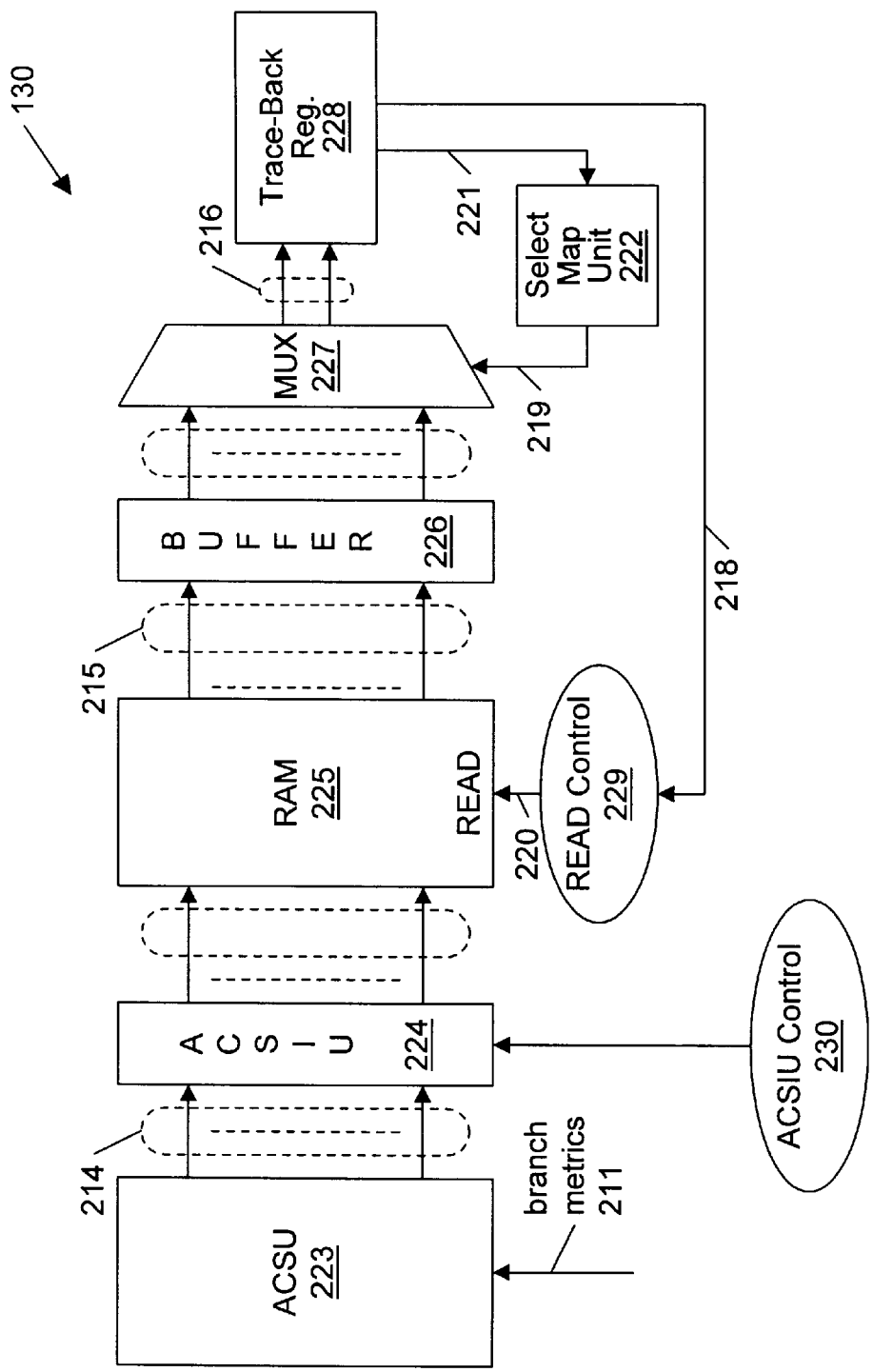
FIG. 5 is a block diagram of a Viterbi decoder used to store survivor paths and produce improved traceback decoding according to the present invention.

FIG. 5 shows a functional block diagram of Viterbi decoder 130. Survivor weight determination consists of calculating a plurality of edge metrics 211, executing an add-compare-select (ACS) algorithmic routine within an ACS unit 223, feeding a plurality of survivor path selections 214 resulting from that routine to an ACS interface unit 224 which pre-processes the information before storing it in a RAM 225. For every write to RAM 225, a traceback process will occur. Details on the traceback process will be provided below. Contents from a traceback register 228 will be used by a read control circuit 229 to access a plurality of bits 215 contained in a memory location 220. A buffer 226 serves to provide support for asynchronous RAM access and is not required for synchronized read and write access. Memory contents 215 are then forwarded via buffer 226 to a multiplexer 227. A select map unit 222 then directs multiplexer 227 to select a portion of memory contents 215 for input to traceback register 228. Select map unit 222 makes its determination based on the contents of traceback register 228. By iterating through the above steps, the traceback process performs a backwards trace through memory of a survivor path. After a predetermined number of iterations, the trace yields decoding decisions based on the selected transitions. Each of the steps will be explained in greater detail below.

Several variants on metric calculation exist. The distance used is typically the squared Euclidean distance. The formula is $$M_c = (y-c)(y-c)^T,$$

where y represents the received signal, c is the code word, and T is the transpose operator. In general y and c are row vectors and this equation is an inner product which yields a scalar value: the sum of the squares of the components of the difference vector. Investigating this relationship more closely it can be determined that no squaring is necessary to calculate useful metrics:

$$M_c = \text{SUM}_{i=1,n}\{y_i^2 - 2c_iy_i + c_i^2\}$$

$$M_c = \text{SUM}_{i=1,n}\{y_i^2\} + \text{SUM}_{i=1,n}\{-2c_iy_i\} + \text{SUM}_{i=1,n}\{c_i^2\}$$

The first term in this equation is common to all the metrics. Since the object is to find the minimum weight, subtraction of common value from all metrics will not affect the outcome. Therefore, the first term can be dropped. In reference to the last term, the components ci of the code word are 0 and 1, hence squaring them has no effect. The metric equation is therefore reduced and now reads:

$$M_c = \text{SUM}_{i=1,n}\{c_i(1-2y_i)\}$$

and is easily performed by passing the decoder input 132 through a gain and dc-offset circuit, gating the output based on whether ci is 0 or 1, and summing the components using a resistor network.

As previously described, the weight of each transition is the sum of the weight of the state it originates from and the metric of the code word that corresponds to that transition. This is the next step in the survivor weight determination. The weight of each state at time t+1 is found by choosing the minimum weight of the incoming transitions. The expressions in FIG. 2 are used to evaluate the weight of the states at time t+1. For example, the second equation, repeated below, is evaluated in the following manner: the weight of state 001 at time t+1 is the minimum of either (1) the weight of state 010 at time t plus the metric for code word 101, or (2) the weight of state 011 at time t plus the metric for code word 010.

$$W^{t+1}{}_{001}=\min\{(W^t{}_{010}+M^t{}_{101}),(W^t{}_{011}+M^t{}_{010})\}$$

For the present example, each state has only two incoming transitions (i.e., for every state at time t+1 there are two incoming transitions from two states at time t), but in general the number of incoming transitions may be a larger power of two. A larger number of incoming transitions has the effect of necessitating additional comparisons to eliminate candidates for the minimum weight transition. For each state at time t+1, a signal representing which transition is selected is passed to ACS interface unit 224.

Figure 2B:
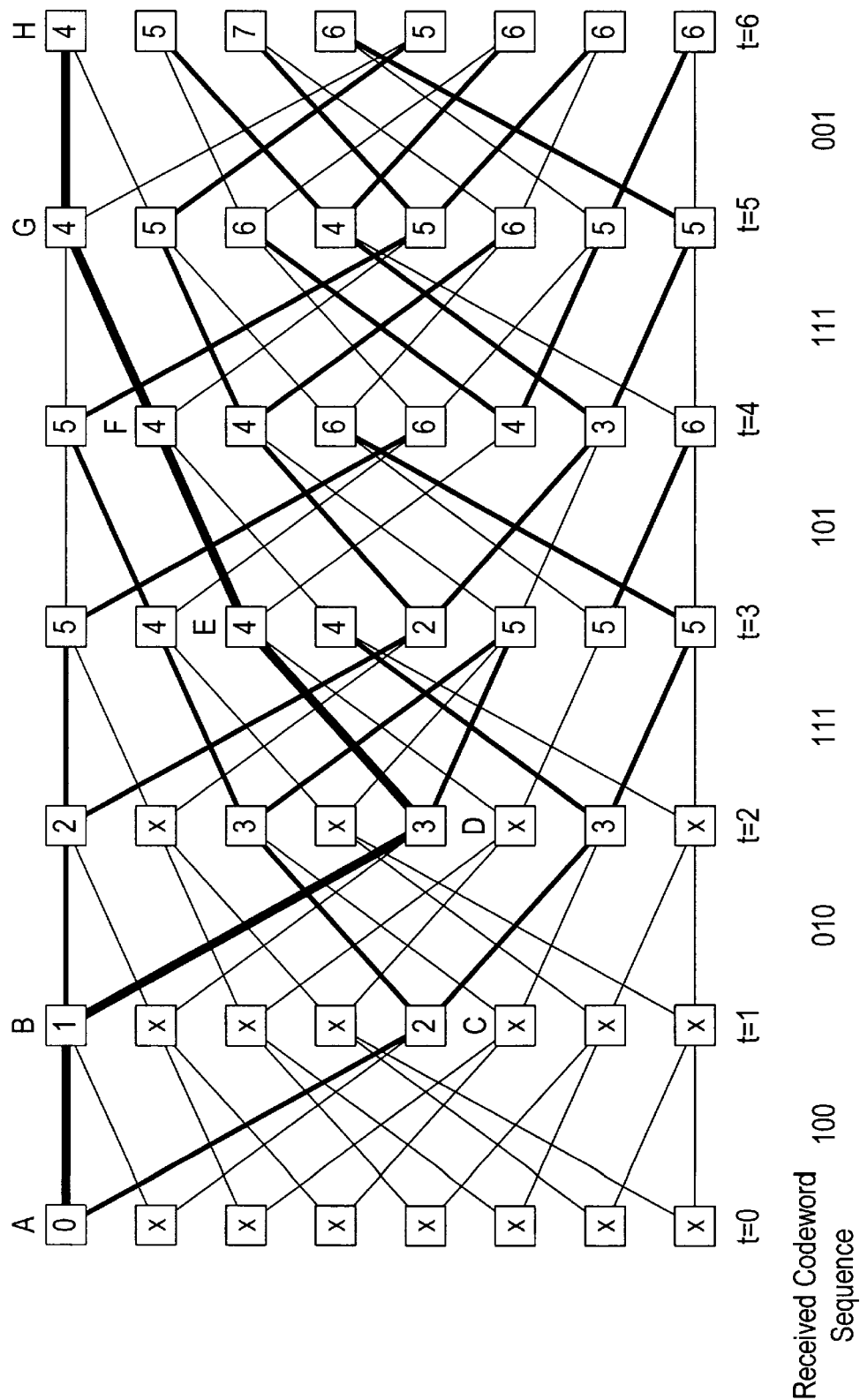
FIG. 2b is an expanded trellis diagram of the eight state, rate 1/3 convolutional code illustrating an algorithm whereby weights are assigned to states within each of the eight states offered in chronological order.
Figure 3:
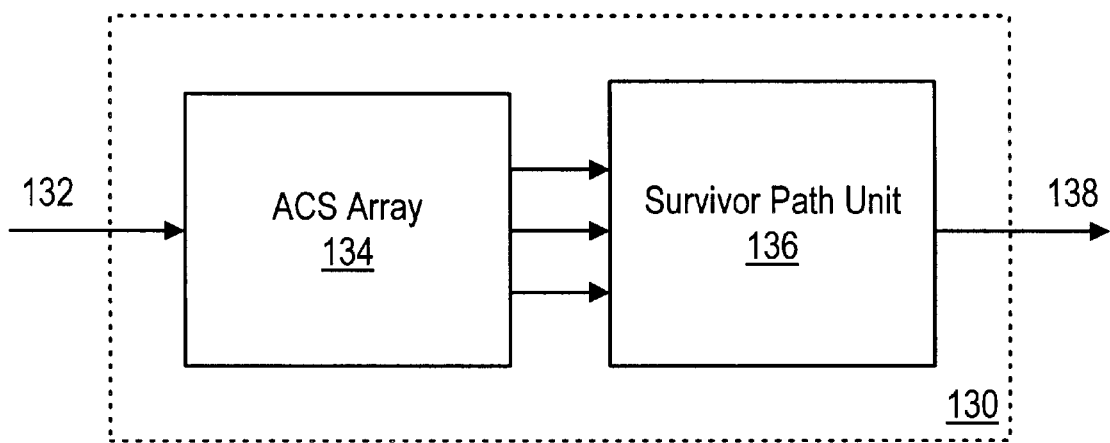
FIG. 3 is a block diagram of a Viterbi decoder.

ACS interface unit 224 concatenates selected transitions from four time steps together to form a four-length path segment for each state. Referring to FIG. 2b, for example, the four-length path segment which reaches state F at time t=4 is ABDEF. This path segment may be stored (and decoded) as 0100. At time intervals which are multiples of four, these path segments are stored in RAM. The method for storing and retrieving these path segments is described below.

One standard convolutional code which has widespread use is a rate 1/2, K=7 code with octal generators (133,171). This code has 64 possible encoder states, so there are 64 states at each time step in the decoder lattice. Each of the possible encoder states is specified by a shift register which contains the six previous input bits to the encoder. If we presume to operate in increments of four time steps, each increment will result in four new input bits entering the shift register, leaving only two bits from the representation of the previous encoder state.

Figure 6:
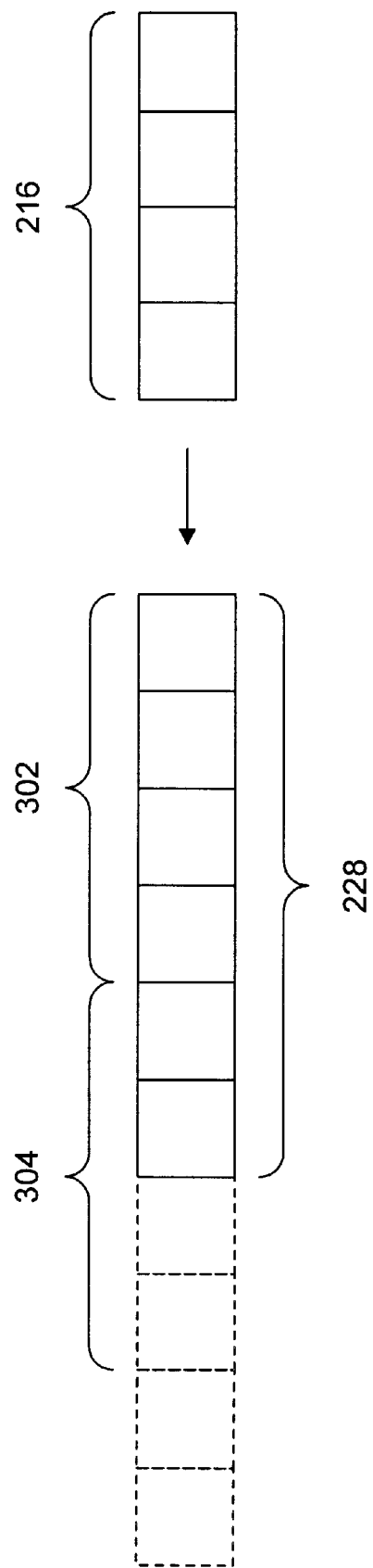
FIG. 6 is an illustration of the time progression of the contents of a traceback register.

The traceback process employs a traceback register 228 such as that shown in FIG. 6. Traceback register 228 comprises six slots, each of which holds a bit value. Traceback register 228 is a six-bit shift register which functions in the direction opposite that of the encoder state register. The six bits in the traceback register are the row address of a memory location corresponding to a state in the decoder trellis. The content of that memory location is a four-length path segment 216 which serves as a "pointer" to a previous state. The row address of the memory location corresponding to the previous state is given by shifting four-bit path segment 216 into traceback register 228 backwards (the bit corresponding to the earliest time interval enters last). As shown in FIG. 6, there are three path segments involved in one step of the traceback process. A current four-bit path segment 302, in conjunction with a previous four-bit path segment 304, is used as an address of a memory location containing a subsequent four-bit path segment 216.

In the interest of speed, an entire column of memory (all 64 four-bit path segments for the previous time step) may be read out in parallel in anticipation of the next required memory access. This would be done during the decode operation of contents of the current memory location and the multiplexer selection of one four-bit path segment from the 64 possible path segments. At the high decoding clock speeds required recently, a single RAM is unable to provide the required read bandwidth for this strategy. Instead, multiple RAMs are used, requiring the use of increased space and complexity.

When shifting the current four-bit path segment into the six-bit traceback register, the first two bits from the previous four-bit path segment are still present in the traceback register. This suggests that given the row address of the current memory location, we already possess some knowledge concerning the row address of the next memory location which must be accessed. By splitting the 64 four-bit path segments into four groups, each group having in common the same first two bits in the four-bit path, it becomes possible to read in parallel only a single group from memory in anticipation of the next required memory read. This is the underlying motivation for the memory organization described below.

As mentioned above, ACS interface unit 224 concatenates selected transitions from four time steps together to form a four-bit path segment for each of 64 states. The 128 resulting bits are written to four 64-bit words. The four words correspond to the four groups described above. The path segments which begin with 00 are written to the first word, 01 to the second word, and so forth. In addition to the speed gain resulting from the reduction in data which is accessed for each read, a gain results also from the need to multiplex from only 16 path segments to one instead of 64 path segments to one.

Figure 7:
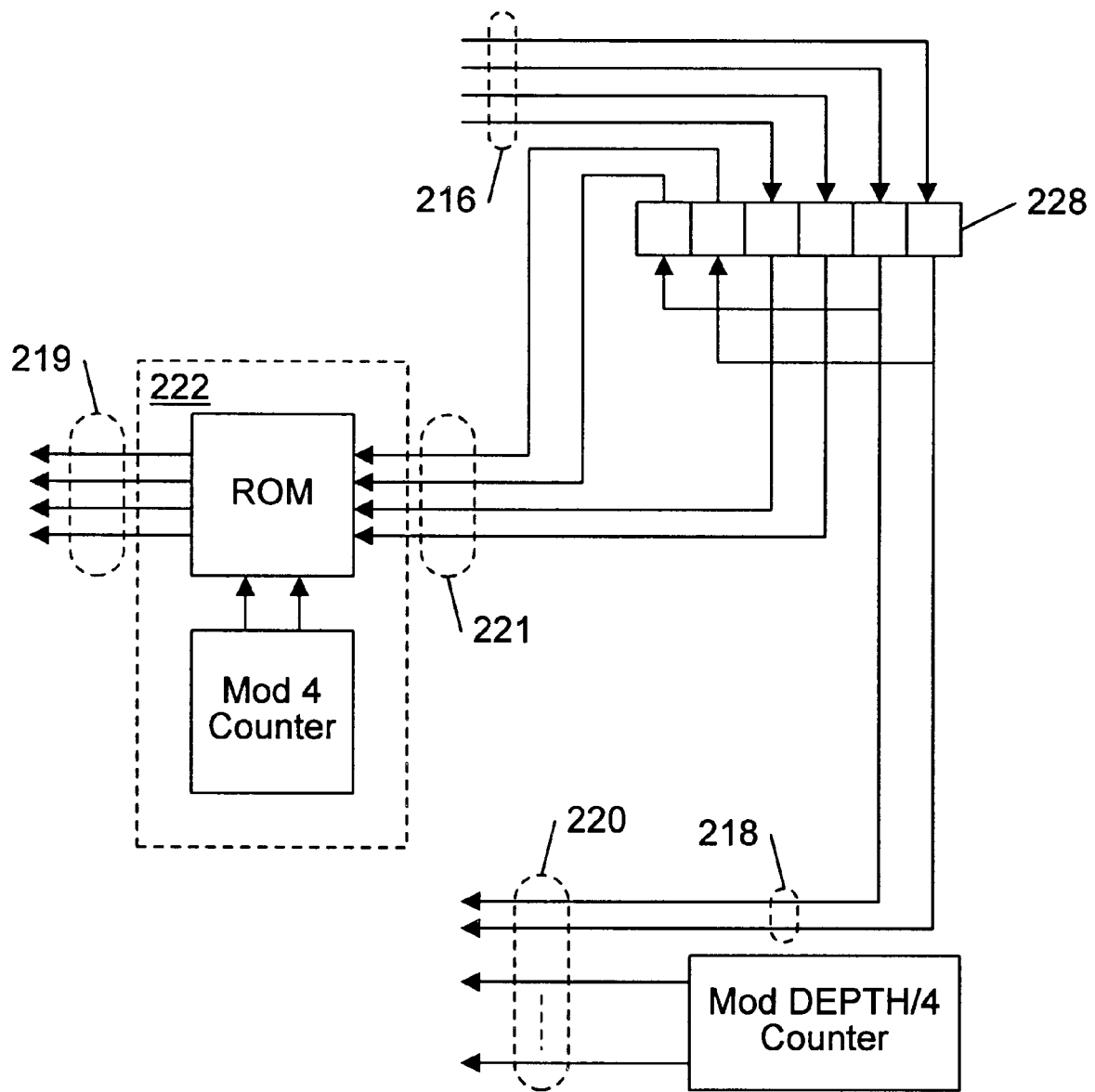
FIG. 7 is a block diagram of the traceback portion of the Viterbi decoder presented in FIG. 5 according to the present invention.

FIG. 7 illustrates one possible implementation of the traceback mechanism. Traceback register 228 simultaneously shifts two bits to the end of the register and loads a four-bit path segment 216. The first two bits 218 of the four-bit path segment are immediately used to initiate a memory read of a 64 bit word. A counter is used to determine which column of memory (i.e. which four-time-step increment) will be accessed. In parallel, a four bit signal 221 from the traceback register is used to generate a multiplex signal 219 to multiplex the correct four-bit path segment from the 16 which have already been retrieved from memory. Select map unit 222 uses four-bit signal 221 in combination with knowledge of the organization of path segments within the word to determine the location of the correct path segment. The organization is predetermined based on layout considerations of the ACS interface unit, and stored in the form of a memoryless read-only memory. A counter may also be required for systolic array implementations of the ACS interface unit.

In summary to what has been presented above, a Viterbi decoder has been described which determines state weights from previous state weights and code word metrics. The state weights calculated by choosing the minimum incoming transition weight (found by adding a code word metric to a previous state weight) correspond to probabilities for the "survivor" paths that reach the states. By maintaining a record of a survivor path for each state (i.e. the most likely sequence of transitions to reach that state), the overall decision as to which path constitutes "the correct" path through the decoder trellis can be postponed until some criterion is met. One possible criterion is a simple predetermined delay. At this time, a decision is made by choosing the current state with the smallest weight. The "correct" (i.e. most likely) path may be found by "tracing back" through the trellis, in a novel manner as described above. This path can then be decoded from left to right according to the stipulation that taking the uppermost transition leaving a state corresponds to a decoded zero, and that taking the lowermost transition leaving a state yields a decoded one.

Numerous variations and modifications will become apparent to those skilled in the art once the above disclosure is fully appreciated. It is intended that the following claims be interpreted to embrace all such variations and modifications.

What is claimed is:

1. An apparatus for Viterbi decoding of an encoded signal comprising:

an execution unit adapted to receive said encoded signal represented as a sequence of code words indicative of transitions between successive encoder states, wherein the execution unit attributes said transitions to a plurality of respective survivor path extensions;

an interface unit coupled to said execution unit for receiving said survivor path extensions and forming a first path segment from a defined number of said survivor path extensions;

a memory unit coupled to said interface unit for storing said first path segment; and a traceback register having a number of register slots greater than the defined number of said survivor path extensions, wherein the traceback register is coupled to said memory unit to receive a sequence of path segments comprising the first path segment and a second path segment which arrives upon the traceback register subsequent to the first path segment, and wherein the second path segment displaces a portion of said first path segment within the traceback register, and wherein the portion is forwarded to said memory unit for partially addressing a third path segment whose address is completed upon dispatch of said second path segment.

2. The apparatus for Viterbi decoding as recited in claim 1, wherein a survivor path is formed from said plurality of survivor path extensions, said plurality of survivor path extensions being those transitions between successive encoder states which would produce a valid sequence of code words that is closest to said encoded signal.

3. The apparatus for Viterbi decoding as recited in claim 2, wherein decoding is achieved by tracing said survivor path from a current time step to an earlier time step, said survivor path including said plurality of survivor path extensions which have been formed into said first, second, and third path segments.

4. The apparatus for Viterbi decoding as recited in claim 1, wherein the interface unit is configured to produce a group of path segments which share a common partial address in said memory unit.

5. The apparatus for Viterbi decoding as recited in claim 1, wherein said defined number of survivor path extensions in a path segment is four, and said number of register slots is six.

6. The apparatus for Viterbi decoding as recited in claim 1, wherein said memory unit consists essentially of a single array of transistors.

7. The apparatus for Viterbi decoding as recited in claim 1, wherein said memory unit consists essentially of multiple arrays of transistors.

8. A digital communications system comprising:

an encoder configured to receive a digital signal and thereafter provide an encoded digital signal;

a discrete-time channel coupled to receive and transport said encoded digital signal;

a Viterbi decoder comprising:

an execution unit configured to receive said encoded signal and thereafter determine a survivor weight and a survivor path extension for each of a plurality of possible encoder states;

a memory unit coupled to receive a path segment consisting of a defined number of survivor path extensions for each of said plurality of possible encoder states; and a traceback register of a length greater than said defined number of survivor path extensions in a path segment, coupled to said memory unit to receive a sequence of path segments comprising a current path segment and a subsequent path segment by iteratively displacing a portion of the contents of said traceback register by said defined number for each path segment of said sequence, wherein said portion is used to read a group of potential subsequent path segments from said memory unit and the current path segment is thereafter used to determine said subsequent path segment from said group.

9. The digital communications system as recited in claim 8, wherein an interface unit is interposed between said execution unit and said memory unit, said interface unit configured to receive said number of survivor path extensions, configured to arrange the path segments into a plurality of groups of potential subsequent path segments, and thereafter provide said groups to the memory unit.

10. The digital communications system as recited in claim 8, wherein said defined number of survivor path extensions in a path segment is four, and said length of the traceback register is six.

11. The digital communications system as recited in claim 8, wherein said memory unit consists of a single RAM.

12. The digital communications system as recited in claim 8, wherein said memory unit consists of more than one RAM.

13. A method for Viterbi decoding of an encoded signal comprising the steps of:

receiving said encoded signal and thereafter determining a survivor weight and a survivor path extension for each of a plurality of possible encoder states;

storing in a memory unit a path segment consisting of a defined number of survivor path extensions for each of said plurality of possible encoder states; and using a traceback register of a length greater than said defined number of survivor path extensions in a path segment to receive a sequence of path segments comprising a current path segment and a subsequent path segment by iteratively displacing a portion of the contents of said traceback register by said defined number for each path segment of said sequence, determining from said portion a memory unit location of a group of potential subsequent path segments, and thereafter determining from the current path segment said subsequent path segment from said group.

14. The method of claim 13 wherein the method further comprises the steps of:

forming path segments from said defined number of survivor path extensions; and arranging the path segments into a plurality of groups of potential subsequent path segments prior to storing the path segments in said memory unit.

15. The method of claim 13, wherein said defined number of survivor path extensions in a path segment is four, and said length of the traceback register is six.

16. The method of claim 13, wherein said memory unit consists of a single RAM.

17. The method of claim 13, wherein said memory unit consists of more than one RAM.

* * * * *